Figure 8:
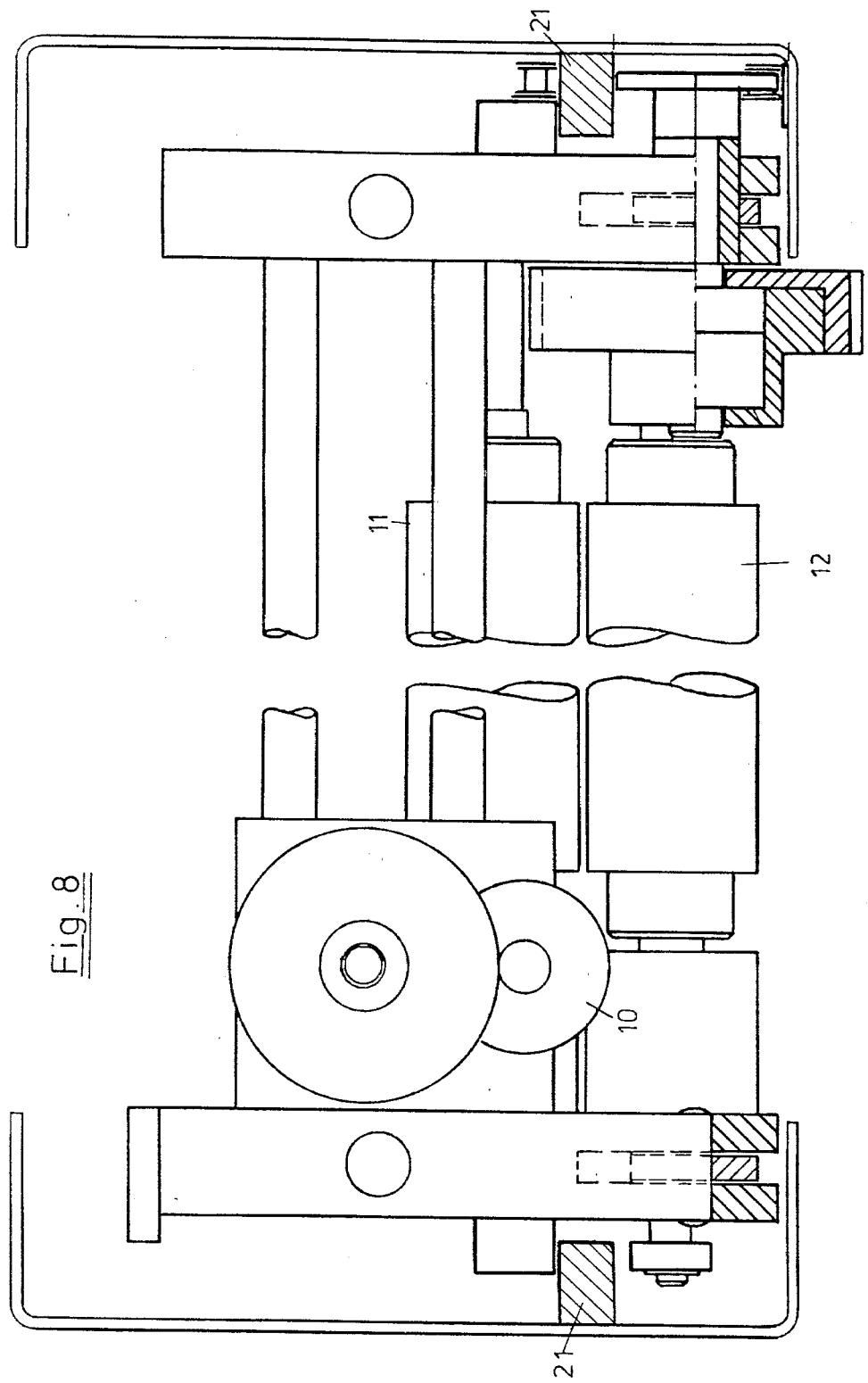

United States Patent [19]

de Masi

[11] 4,344,812
[45] Aug. 17, 1982

[54] DEVICE FOR THE LAMINATION OF INSULATING BOARDS

[76] Inventor: Erika de Masi, Zeisigweg 44, D 6072 Dreieich, Fed. Rep. of Germany

[21] Appl. No.: 183,446

[22] Filed: Sep. 2, 1980

[30] Foreign Application Priority Data

Sep. 1, 1979 [DE] Fed. Rep. of Germany ....... 2935418

[51] Int. Cl.³ ............................................. B32B 31/00
[52] U.S. Cl. .................................... 156/499; 156/549; 156/552; 156/553; 156/555; 156/901
[58] Field of Search ............... 156/499, 549, 552, 553, 156/555, 901

[56] References Cited

U.S. PATENT DOCUMENTS 3,869,330 3/1975 Anderson .............................. 156/499
3,994,769 11/1976 Gersbeck .............................. 156/499

Primary Examiner—Marion McCamish
Attorney, Agent, or Firm—Schwartz, Jeffery, Schwaab, Mack, Blumenthal & Koch

[57] ABSTRACT

The invention concerns a device for the automatic laminating of copper coated insulating plates for the preparation of electric circuit boards with centrally arranged and motor driven laminating rolls.

11 Claims, 8 Drawing Figures

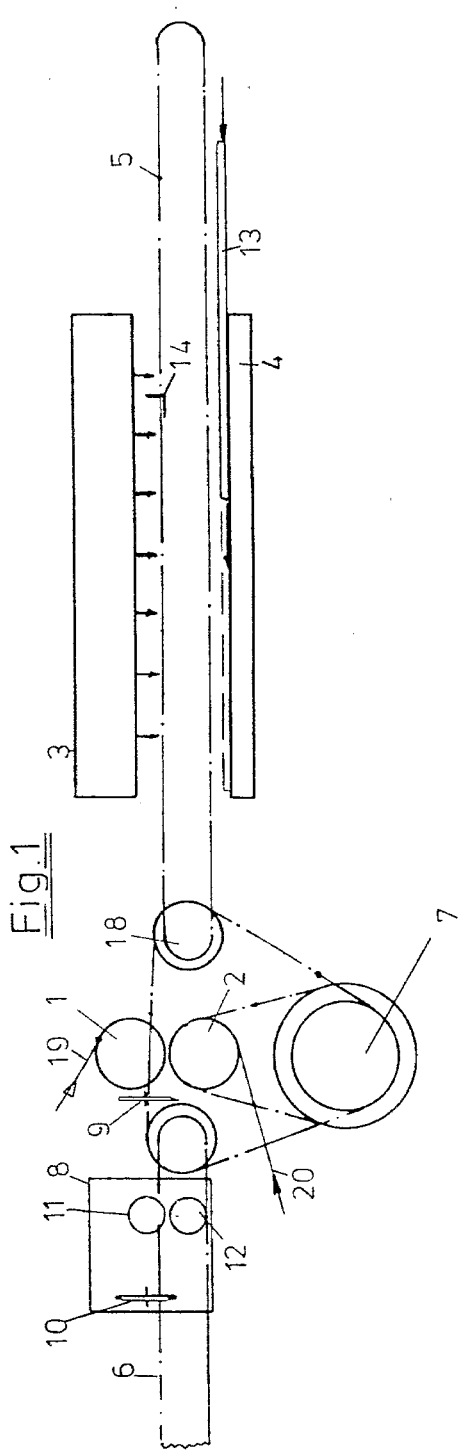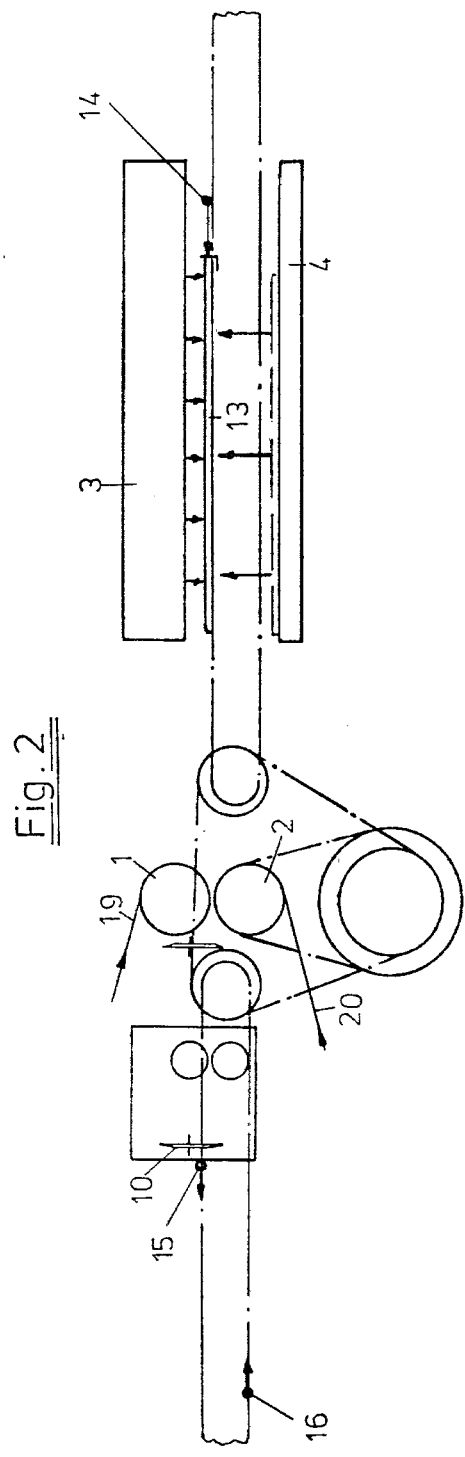

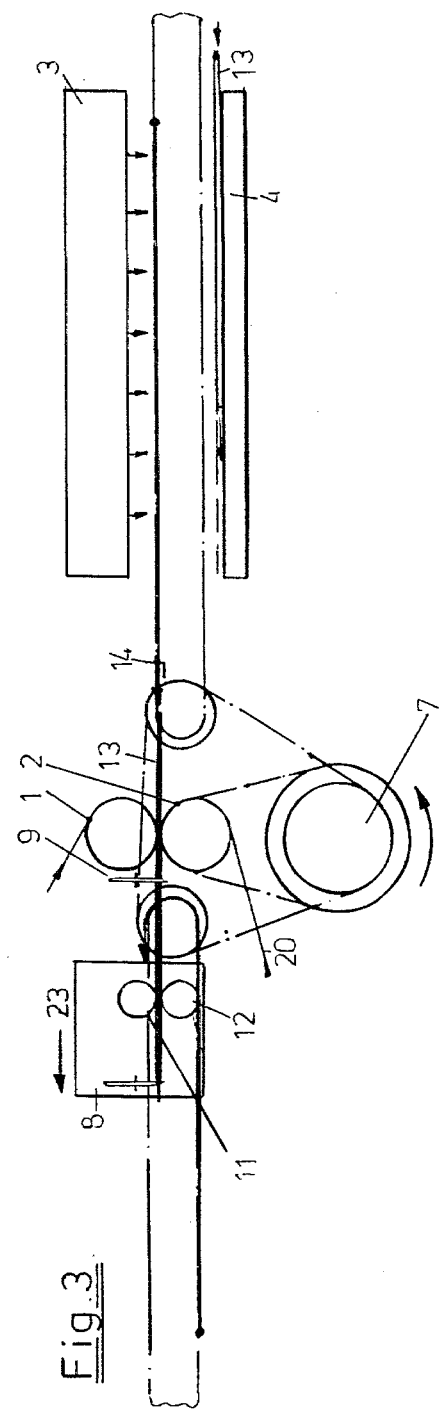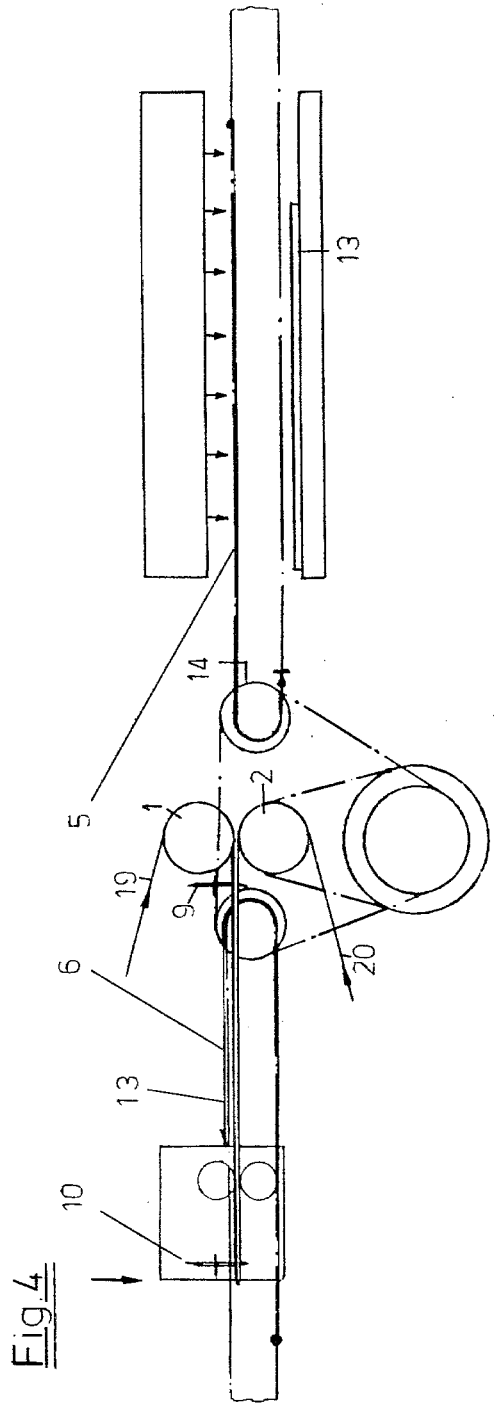

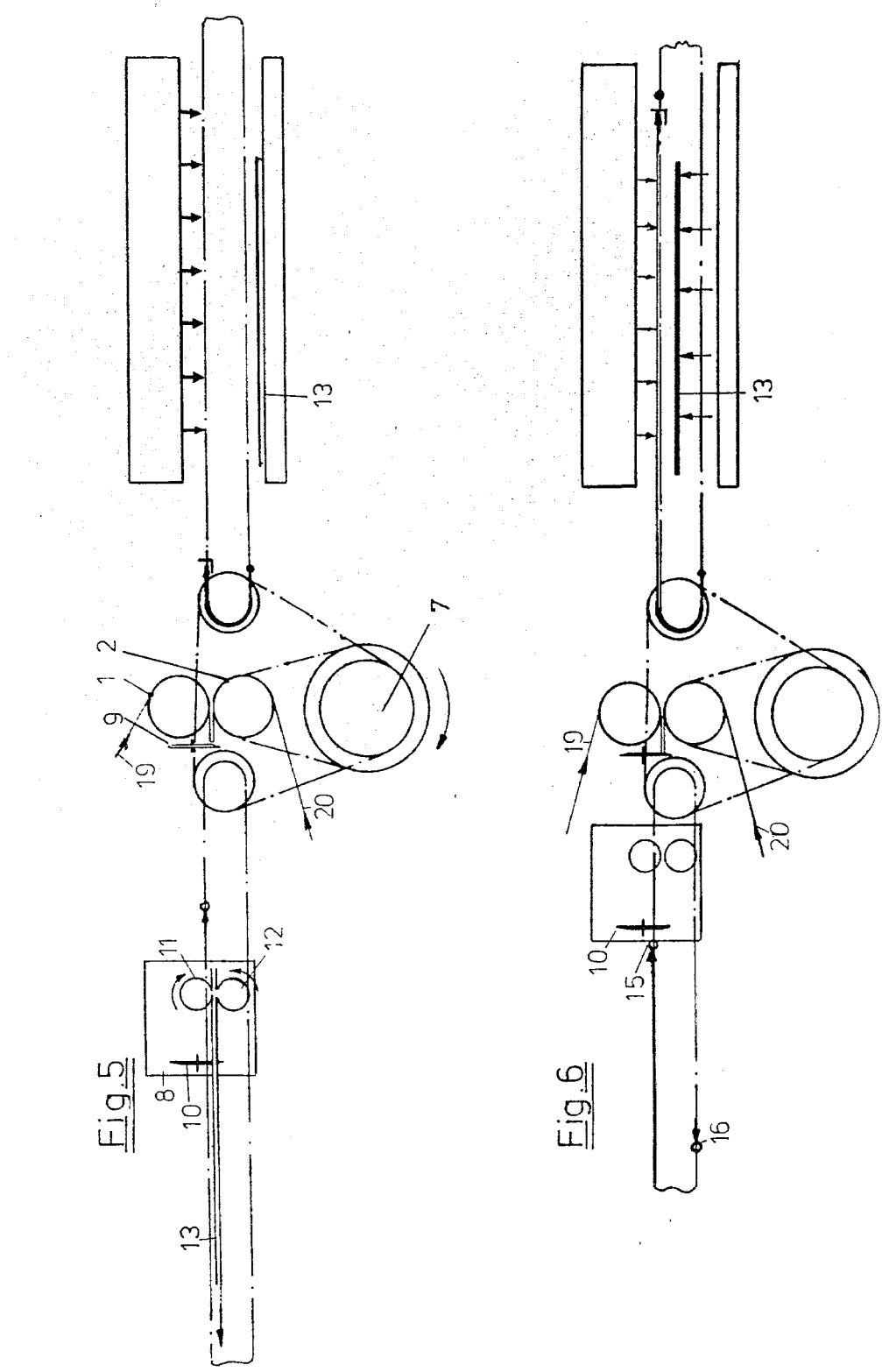

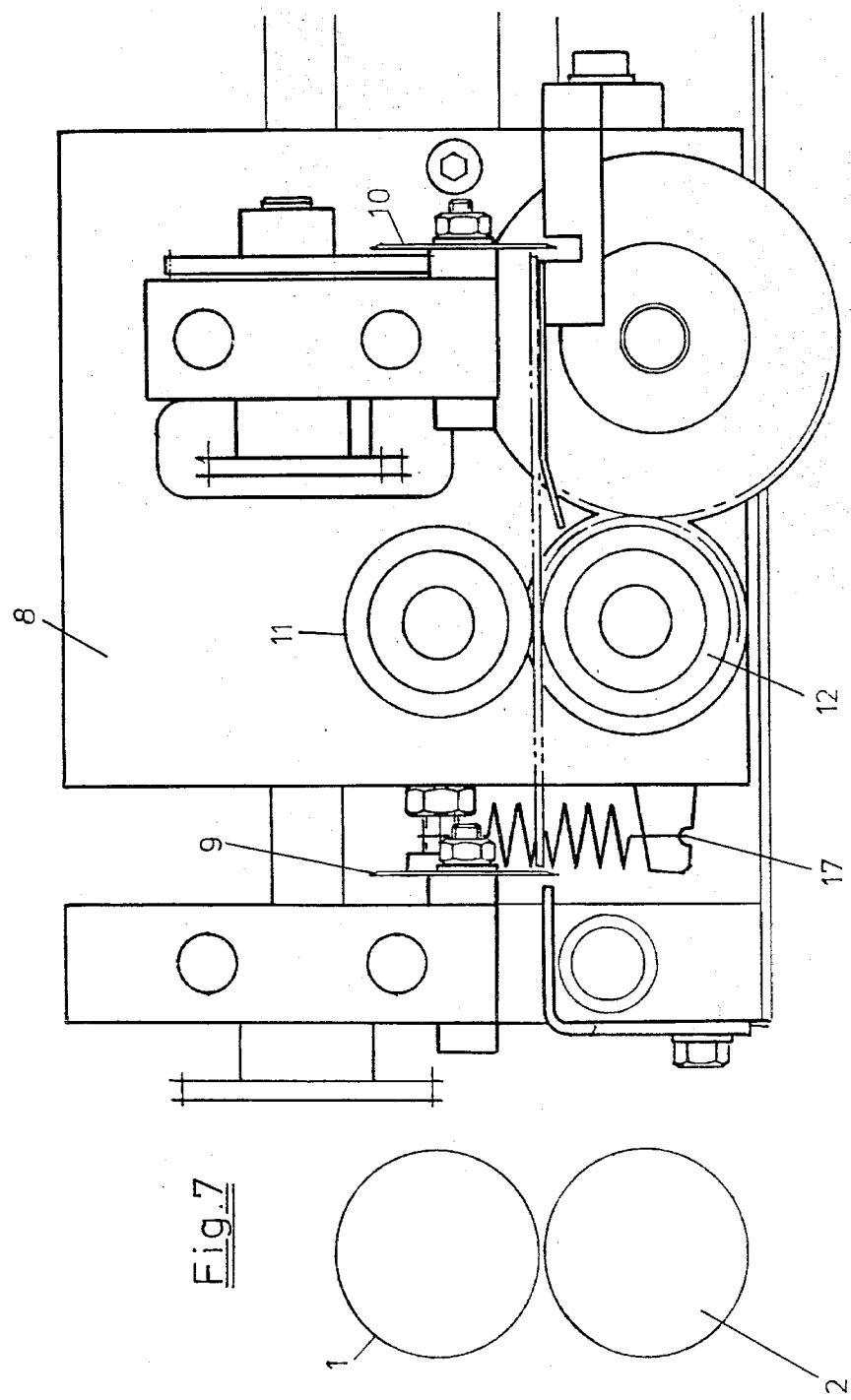

DEVICE FOR THE LAMINATION OF INSULATING BOARDS

Heretofore, the silk screen printing methods have been used for the industrial production of printed circuits, wherein a very fine meshed screen of silk or the like is used as the printing pattern, said screen being mounted in a frame. The screen is saturated with a photoemulsion and exposed to ultraviolet light through a drawing of the circuit located on a transparency, and subsequently placed into a developer. The exposed portions of the screen harden during the development and close the mesh of the screen. The unexposed portions represent the parts of the board destined to become conductors, soldering contact pieces and contacts.

The screen prepared in this manner is placed onto the copper-clad base material to be printed and solderable paint is pressured through the mesh of the screen. A positive pattern is thus created on the copper cladding. The plates subsequently are passed into a continuous furnace and through a cooling section. In a subsequent automatic etching installation the uncovered parts of the copper cladding are etched away. The plates are then thoroughly cleaned, rinsed and are passed through a dryer.

Such a silk screen printing process is, however, very expensive and certain developments have already been underway to replace it by a simplified method. A simplified method of this type consists of the use of light sensitive foil which is adhesively bonded to the copper clad insulating boards. The conducting pattern is then prepared on the insulating board by exposure through a drawing of the circuit on a transparency, followed by developing and etching.

The application of the light sensitive foil to the copper clad insulating board must be effected with extreme care, because there must be absolutely no inclusions of air, since air bubbles may cause breaks in the conducting paths to be produced. Furthermore, it is necessary for reasons of mass production to adapt the light sensitive foil to be applied by means of adhesive bonding accurately to the size of the insulating boards so that no parts of the foil will extend past the insulating boards and that no portions of the light sensitive foil remain uncovered.

It is, therefore, the object of the invention to provide a device for the mechanization of the laminating process of insulating boards for the purpose of automating and integrating in transfer lines for the completed production of electric circuit boards. The device according to the invention is in particular intended to effect the accurate adhesive bonding of the foil to the insulating board without any inclusion of air whatsoever, wherein the size of the foil to be adhesively applied is exactly that of the insulating board. The device of the invention is further intended to yield a high production rate while maintaining a constant quality.

The object of the invention is attained according to the invention in the above-mentioned apparatus by that:
(a) a transport installation passing through a heating apparatus is arranged in front of the spacingly adjustable laminating rolls,
(b) said transport installation is driven, together with a further transport installation following the laminating rolls, by a central motor by means of a friction clutch in a synchronous manner, wherein the second transport installation is mechanically coupled with a cutter beam shuttling in the transfer direction.

Further developments of the device of the invention are effected in keeping with the characteristics set forth in the dependent claims which form a part of this application.

According to the device of the invention, both the insulating board to be laminated and the foil to be applied are heated so that no temperature differences occur in the course of the application between the foil and the board and that at a favorable temperature of between 40° and 75° C. the foil may be applied to the insulating board homogeneously and free of air.

By means of the accurate guidance and positioning of the plate with the aid of the device according to the invention, the laminated foil overlapping the board is cut without a residue, wherein the board feed on the input side is coupled without clearance with the velocity on the output side and thereby coordinated with the velocity of the rolls, so that with different roll pressures there are no deviations in positioning.

The invention shall be explained in more detail with the aid of the drawings illustrating an example of embodiment.

IN THE DRAWING

FIGS. 1 to 6 are schematic representations of the device in cross section, wherein FIGS. 2 to 6 show the same device during operating cycles following each other in time, FIG. 7 shows a partial section through a cutting beam, and FIG. 8 shows a further section through the cutting beam at right angles to the section according to FIG. 7.

FIG. 1 shows in schematic representation a cross section through the device according to the invention. The laminating rolls 1 and 2, which are equipped with internal heating (not shown), effect the application of a light sensitive top sheet 19 to the upper surface of an insulating board and a bottom sheet 20 to the bottom surface of the insulating board 13. The laminating rolls 1 and 2, together with the transport installations 5 and 6 are centrally driven by the motor 7, wherein the drive of the transport installations 5 and 6 is effected by means of a friction clutch. The transport installation 5 on the inlet side passes through a heating device 3 and 4, which in the example represented herein consists of a radiant electric heater 3, equipped with reflective plate 4.

In the transfer direction behind the laminating rolls 1 and 2, a blade 9 movable in the transfer direction is arranged, with the motion of said blade being synchronized with a cutting beam and similarly movable transversely to the transfer direction. The transport installation 6 following on the outlet side is mechanically coupled with the cutting beam 8 shuttling in the transfer direction while in said cutting beam two driving rolls 11 and 12 spring loaded against each other and arranged above each other. For the purpose of the insertion of an insulating board 13 through the heating device into the system of laminating rolls, a slide 14 is coupled with the transport device 5, said slide 14 effecting the forward feed of the insulating board. In a similar manner, a chain jockey 15 for the return of the cutting beam and a chain jockey 16 for the forward motion of the cutting beam are provided, wherein the slide 14 with the chain jockeys 15 and 16 is synchronizingly adjustable by means of a multiple disk friction clutch 18.

Electric heaters are also found within the laminating rolls 1 and 2, so that the foil passed over the laminating rolls arrives in a preheated state on the insulating board that has been preheated to the same temperature.

The blades 9 and 10 are provided in the form of rotating circular knives having a rotating velocity that is higher than their linear velocity in the direction transverse to the transfer direction.

The driving rolls 11 and 12 in the shuttling cutting beam 8 are preloaded against each other by means of the spring 17 shown in FIG. 7, and in the initial position of the cutting beam 8 a certain clearance is provided between the driving rolls 11 and 12 in order to facilitate the inlet of the insulating board 13. This is attained by the fact that the lower driving roll 12 in the receiving position of the cutting beam 8 may be moved by means of a chain pinion 9 against the force of the spring 17 onto an inclined loading surface so that an adequate roll gap corresponding to the thickness of the insulating is available for the introduction of the laminated insulating board 13.

The driving rolls 11 and 12 are equipped with a backstop so that the insulating board 13 is moved forward accurately during the forward transport of the cutting beam 8. During the return of the cutting beam 8 a rotating velocity approximately three times higher than the linear velocity of the cutting beam is imparted to the driving rolls 11 and 12. This insures the release and ejection of the insulating board 13 when the terminal position of the cutting beam 8 on the transport device 6.

FIG. 1 shows the introduction of the insulating board 13 into the lower part of the transport installation 5 wherein it is heated by the reflection plate 4. By means of a transfer device (not shown) the insulating board 13 is placed onto the upper part of the transport installation 5 and transported through the heating installation 3,4 with the aid of the slide 14, as shown in FIG. 2. The heating zone heats the insulating board 13 to a temperature of approximately 40° to 75° C.

FIG. 3 shows the insulating board 13 between the laminating rolls 1 and 2, whereby the top and bottom foils with their protective sheeting removed shortly before are pressed onto the top and bottom surface of the insulating board 13 and thus adhesively bonded thereto. As soon as the front edge of the insulating plate 13 reaches the blade 10 in the cutting beam 8, the cutting beam 8 is transported by means of the chain jockey 16, together with the insulating board 13 in the direction of the arrow 23, while the pinch rolls 11 and 12 apply a clamping effect to the insulating board 13, as soon as the cutting beam 8 has moved slightly in the direction of the arrow 23. At this point in time, the slide 14 of the transport installation 5 has reached its outermost effective position, so that the further transport of the insulating board 13 is effected by the cutting beam and the driving rolls 11 and 12, respectively.

When the end of the insulating board 13 has reached the stationary blade 9, the transport device 6 and the cutting beam 8 are arrested and the transverse drive of the blades 9 and 10, together with the drive for the rotation of the circular blades are activated. By this means, the front and rear edges of the insulating plate 13 are separated from the foil sheets (see FIG. 4). The sides of the top and bottom foils are edged by stationary blades variable with respect to their lateral distance (not shown). During the process of cutting the front and rear edges of the insulating board 13 by the rotating blades 9 and 10, the insulating board 13 is stationary and the rotating velocity of the blades 9 and 10 is higher than their linear velocity in the transverse direction. This measure results in a clean out. Immediately following the transverse separation, the blades 9 and 10 are returned into their lateral terminal position and the return of the cutting beam 8 begins immediately after. Upon the onset of the return movement of the cutting beam 8, the driving rolls 11 and 12 are moved at a rotating velocity that is approximately three times higher than that corresponding to the linear velocity of the cutting beam 8. As at this point in time, the clamping effect on the insulating board 13 is still in force, the latter is thrown out of the cutting installation 8 and proceeds to a plurality of further processing stations (not shown in detail). This ejection process is shown in FIGS. 5 and 6.

Simultaneously with the return of the cutting beam 8 in the terminal position, the slide 14 on the transport installation 5 is also moved into its terminal position to receive another insulating board 13, because a synchronous connection exists between the drives by means of the multiple disk clutch 18. The latter serves to effect adjustments and the adaptation to different sizes of the insulating plates. When the different transport elements and the cutting beam 8 have reached their terminal positions, a new circuit board may be introduced and the laminating process is repeated in the manner described hereinabove.

During the cutting process of the blades 9 and 10, the other transport elements 5 and 6 and the cutting beam 8 are at rest, together with the laminating rolls 1 and 2. The laminating rolls 1 and 2 exert a pressure of uniform strength on the insulating board 13 to be passed through, and immediately after the passage of the insulating board 13 the laminating rolls are pressing against each other so that a short piece of the top and bottom foils between the blade 9 and the tangential points of the rolls 1 and 2 are adhesively bonded to each other. This bonded partial piece is pushed forward by the next insulating board 13 and passed through the driving rolls 11 and 12. This measure leads to the clean bonding of the edges of the insulating plate 13.

FIG. 7 shows a partial section through the cutting beam 8. The driving rolls 11 and 12 are pressed together by the spring 17 and only after the terminal position of the cutting beam 8 (as shown in FIG. 1) has been reached does a pinion run up an inclined surface 21, so that the rolls 11 and 12 open in their terminal position against the pressure of the spring 17.

A friction clutch is inserted between the principal drive 7 and the transport installations 5 and 6, which aids in adjusting the theoretical feed values to the practical values. The relatively high pressure of the rubber covered laminating rolls slightly reduces the geometric radius so that the effective radius is smaller. As a result, however, the theoretical forward rate of the cutting beam is no longer in agreement with the values actually occurring in practice, so that the cutting beam will tend to move more rapidly, which is however, prevented by the driving rolls 11 and 12 by means of their clamping action in the cutting beam. In order to protect the drive at this point in time, a slipping friction clutch is actuated; it is connected with the shaft of the motor 7.

FIG. 8 shows a vertical section of FIG. 7, wherein the special bearing support of the driving rolls 11 and 12 and the guidance of the blade 10 may be seen.

With the aid of the invention, the insulating boards 13 are laminated simultaneously on their top and bottom sides so that an insulating board may carry two different electric circuits. By this feature alone, the production rate is increased by 100% compared with the silk screen process.

I claim:

1. An apparatus for the automatic lamination of copper-coated insulating boards for circuit boards comprising:
   means for transport of an insulating board core toward a laminating station;
   a pair of laminating rolls arranged for receiving said insulating board from said first transport means and comprising a laminating station;
   a motor operatively attached to said laminating rolls for rotation thereof;
   means for heating said insulating board core prior to passage through said laminating rolls;
   means for transport of a laminated insulating board away from said laminating rolls operatively attached to said motor;
   a cutting blade operatively disposed in a cutting beam and moveable in the direction transverse to the laminated insulating board;
   a friction clutch operatively attached to said motor and said cutting beams for synchronized movement and cutting of said laminated insulating board.

2. The apparatus of claim 1 wherein said means for cutting further comprises a second cutting blade synchronized for movement with said cutting beam.

3. The apparatus of claim 2 wherein said blades are rotating circular blades having a rotating velocity that is higher than their linear velocity transverse to the transfer direction.

4. The apparatus of claim 3 wherein said movable cutting beam comprises two driving rolls spring loaded against each other and mounted on a beam member.

5. The apparatus of claim 4 wherein said movable cutting beam comprises a lower driving roll operatively arranged for transverse movement of said cutting beam, a chain jockey attached to said lower driving roll and a spring communicating with said chain jockey to hold said lower driving roll in a position to form a gap for insertion of said laminated insulated board in said movable cutting beam.

6. The apparatus of claim 5 wherein said driving rolls rotate at a velocity approximately three times greater than the linear velocity of the cutting beam.

7. The apparatus of claim 6 wherein said means for heating said insulation board core comprises a radiating electric heater arranged above said means for transport of said insulating board core and a reflector plate arranged beneath said means for transport of said insulating board core.

8. The apparatus of claim 7 further comprising an electric heating means in each of said laminating rolls.

9. The apparatus of claim 8 further comprising a slide member operatively connected with said insulating board core transport means and a multiple disk clutch operatively disposed to said movable cutting beam for synchronous movement of said insulating board core towards said movable cutting beam.

10. The apparatus of claim 9 further comprising means for simultaneously laminating the top and bottom surfaces of said insulating board core.

11. The apparatus of claim 9 wherein said means for simultaneous lamination comprise a pair of adjustable laminating rolls.

* * * * *